(12) United States Patent
Goldstein et al.

(10) Patent No.: US 8,456,217 B2
(45) Date of Patent: Jun. 4, 2013

(54) APPARATUS FOR INTERFACING CIRCUIT DOMAINS

(75) Inventors: Stephan Goldstein, North Reading, MA (US); Javier Salcedo, North Billerica, MA (US)

(73) Assignee: Analog Devices, Inc., Norwood, MA (US)

( * ) Notice: Subject to any disclaimer, the term of this patent is extended or adjusted under 35 U.S.C. 154(b) by 13 days.

(21) Appl. No.: 13/196,196

(22) Filed: Aug. 2, 2011

(65) Prior Publication Data

US 2013/0033299 A1    Feb. 7, 2013

(51) Int. Cl.
*H03L 5/00*    (2006.01)

(52) U.S. Cl.
USPC .............................. 327/333; 326/82; 327/173

(58) Field of Classification Search
USPC ...................... 326/82–87, 62–68, 56; 327/333
See application file for complete search history.

(56) References Cited

U.S. PATENT DOCUMENTS

| | | | | |
|---|---|---|---|---|
| 6,114,840 | A * | 9/2000 | Farrell et al. | 327/374 |
| 6,954,100 | B2 * | 10/2005 | Dharne et al. | 327/333 |
| 6,970,032 | B1 * | 11/2005 | Smith et al. | 327/407 |
| 7,005,889 | B2 * | 2/2006 | Sowden et al. | 326/81 |
| 7,049,865 | B2 * | 5/2006 | Parker et al. | 327/143 |
| 7,167,017 | B2 * | 1/2007 | Arora et al. | 326/21 |
| 7,541,835 | B1 * | 6/2009 | Shaikh et al. | 326/56 |
| 7,737,755 | B2 * | 6/2010 | Mauthe et al. | 327/333 |
| 7,817,386 | B2 * | 10/2010 | Ker et al. | 361/56 |

OTHER PUBLICATIONS

Shih-Hung Chen, Ming-Dou Ker, Active ESD Protection Design for Interface Circuits Between Sparated Power Domains Agains Cross-Power-Domain ESD Stresses, IEEE Transactions on Device and Materials Reliability, vol. 8, No. 3, Sep. 2008, p. 549-560.*
Danut Burdia, Alexandru Lazar, Luminita-Camelia Lazar, Iolanda-Elena Alecsandrescu, Power-on Reset Circuit for SoC with Multiple I/O Power Supplies, International Symposium on Signals, Circuits and Systems, ISSCS 2011, Jun. 30-Jul. 1, 2011.*

* cited by examiner

*Primary Examiner* — Shawki Ismail
*Assistant Examiner* — Nelson Correa
(74) *Attorney, Agent, or Firm* — Kenyon & Kenyon LLP

(57) ABSTRACT

An interface circuit for controlling a cross-domain signal link between a first circuit domain and a second circuit domain in a circuit may include first and second controllers, each of the first and second controllers including a first input coupled to a first voltage source of the first circuit domain and a second input coupled to a second voltage source of the second circuit domain. The interface circuit may further include a first switch controlled by an output of the first controller, the first switch including a first end coupled to the cross-domain signal link and a second end coupled to a first defined voltage state, and a second switch controlled by an output of the second controller, the second switch including a first end coupled to the cross-domain signal link and a second end coupled to a second defined voltage state, in which during a power-up of the circuit, if one of the first and second voltage sources is unavailable, at least one of the first and second controllers generates a control signal to engage at least one of the first and second switches and pull the cross-domain signal link to one of the first and second defined voltage states, while providing cross-domain protection against field-induced charge device model (FICDM) stress conditions at small drivers and receiver inputs connected to the signal interface link.

19 Claims, 16 Drawing Sheets

APPARATUS FOR INTERFACING CIRCUIT DOMAINS

FIELD OF THE INVENTION

The present invention is directed to integrated circuits. In particular, the present invention is directed to interfacing between different power domains in the integrated circuits.

BACKGROUND INFORMATION

Large digital and/or mixed-signal integrated circuits (IC) often contain multiple power supply domains. A power supply domain is a block of circuitry that receives the operating power from a unique source of power supply. For example, a mixed-signal chip may use one power supply for the (usually larger) digital section, and a second for the (usually smaller) analog section. This arrangement keeps digital switching noise arising in the digital section from interfering with potentially noise-sensitive analog signals in the analog section. Complexity of cross-domain signaling interface circuits increases as a large number of low voltage precision signal processing circuits are integrated in the same system (or, system on a chip (SoC)) along with the large digital control circuitry, microelectromechanical (MEMS) sensors, and high voltage power drivers. While this array of different voltage domains enables ambitious applications to be monolithically integrated into the same substrate, it poses challenges to the robustness of the circuit during cross domain powering and cross-domains stress events.

FIG. 1 illustrates a layout of a mixed-signal integrated circuit (IC) 2 that includes multiple power supply domains. The mixed-signal IC as shown in FIG. 1 includes an analog circuit section 4, a digital circuit section 6, and an input/output (I/O) circuit section 8. Each of these circuit sections is coupled to a unique power supply. Commonly, the negative terminals of all the supply domains are connected together on the circuit board, though they may or may not be connected together on the chip. The positive terminals may be at the same or different voltages. Referring to FIG. 1, the positive terminal of the digital domain is labeled as DVDD and negative terminal is labeled as DVSS. Similarly, the positive and negative terminals of the analog section and the I/O section may be labeled as AVDD/AVSS and IOVDD/IOVSS, respectively. We will further assume that all _VSS terminals are intended to be at essentially the same electrical potential, this being accomplished by direct connection either on- or off-chip.

The circuit sections may be interconnected via cross-domain signal links. For example, the analog circuit section 4 is connected to the digital circuit section 6 via a cross-domain signal link 10 and connected to the I/O circuit section 8 via a cross-domain signal link 14. Digital circuit section 6 is connected to I/O circuit section 8 via a cross-domain signal link 12. In many cases, all supply domains are powered by the IC user's system. There is no a priori guarantee that power is applied to all domains simultaneously, nor is there any specified limit on the amount of time that might elapse between application of power to the first domain and application of power to the second (or third, or fourth).

It is often desirable to ensure that digital control signals crossing from one domain to another are in well-defined states before all domains are powered. This is especially true when a receiving domain is powered, but the associated transmitting domain is not. It is possible that the receiving circuit could dissipate large amounts of power if the driving signal is not well-defined, causing localized heating or unnecessarily draining a battery. If dedicated cross-domain electrostatic (ESD) protection devices are situated between domains to enhance the IC robustness, those devices can actually be overstressed and get damaged, since they are not designed to operate in DC conditions.

To overcome these problems, level-translators are often employed to interface cross-domain signals (even if the two domains operate at the same nominal supply voltage). Level-translators that provide a deterministic output value if one of the domain supplies is absent are known in the art. Thus, a level-translator is used for each interconnection between two circuit sections. However, when a large number of circuit sections co-exist on a mixed-signal IC, the number of level translators needed is proportionally large and can consume a substantial amount of die area with increased cost. Further, level-translators interpose an additional delay in signal transmission that may be unacceptable for signals with critical timing requirements. Finally, level translators remain active at all times, thereby increasing power dissipation when the cross-domain signals are actively switching.

DETAILED DESCRIPTION

Thus, there is a need for circuits that control states of cross-domain signal links between circuit domains and that occupy little circuit area, consume minimum power and insert no or little delay to cross-domain signal links and enhance protection robustness in complex SoC. It is one of the objectives of the present invention to ensure that cross-domain signals are held in well-defined logic states until all domains are powered up without using level translators.

Embodiments of the present invention may include an interface circuit for controlling a cross-domain signal link between a first circuit domain and a second circuit domain in a circuit. The interface circuit may include first and second controllers, each of the first and second controllers including a first input coupled to a first voltage source of the first circuit domain and a second input coupled to a second voltage source of the second circuit domain. The interface circuit may further include a first switch controlled by an output of the first controller, the first switch including a first end coupled to the cross-domain signal link and a second end coupled to a first defined voltage state, and a second switch controlled by an output of the second controller, the second switch including a first end coupled to the cross-domain signal link and a second end coupled to a second defined voltage state, in which during a power-up of the circuit, if one of the first and second voltage sources is unavailable, at least one of the first and second controllers generates a control signal to engage at least one of the first and second switches and pull the cross-domain signal link to one of the first and second defined voltage states.

Embodiments of the present invention may include a cross-domain co-designed interface circuit for controlling a cross-domain signal link between a first circuit domain and a second circuit domain in a circuit and preventing electric-static discharge (ESD) events. The co-designed interface circuit may include first and second controllers, each of the first and second controllers including a first input coupled to a first voltage source of the first circuit domain and a second input coupled to a second voltage source of the second circuit domain. The co-designed interface circuit may include a PMOS, including a gate coupled to an output of the first controller, a source coupled to a first reference voltage of the first circuit domain, and a drain coupled to the cross-domain signal link, and a NMOS, including a gate coupled to an output of the second controller, a source coupled to a second reference voltage of the first circuit domain, and a drain coupled to the cross-domain signal link.

Figure 1:
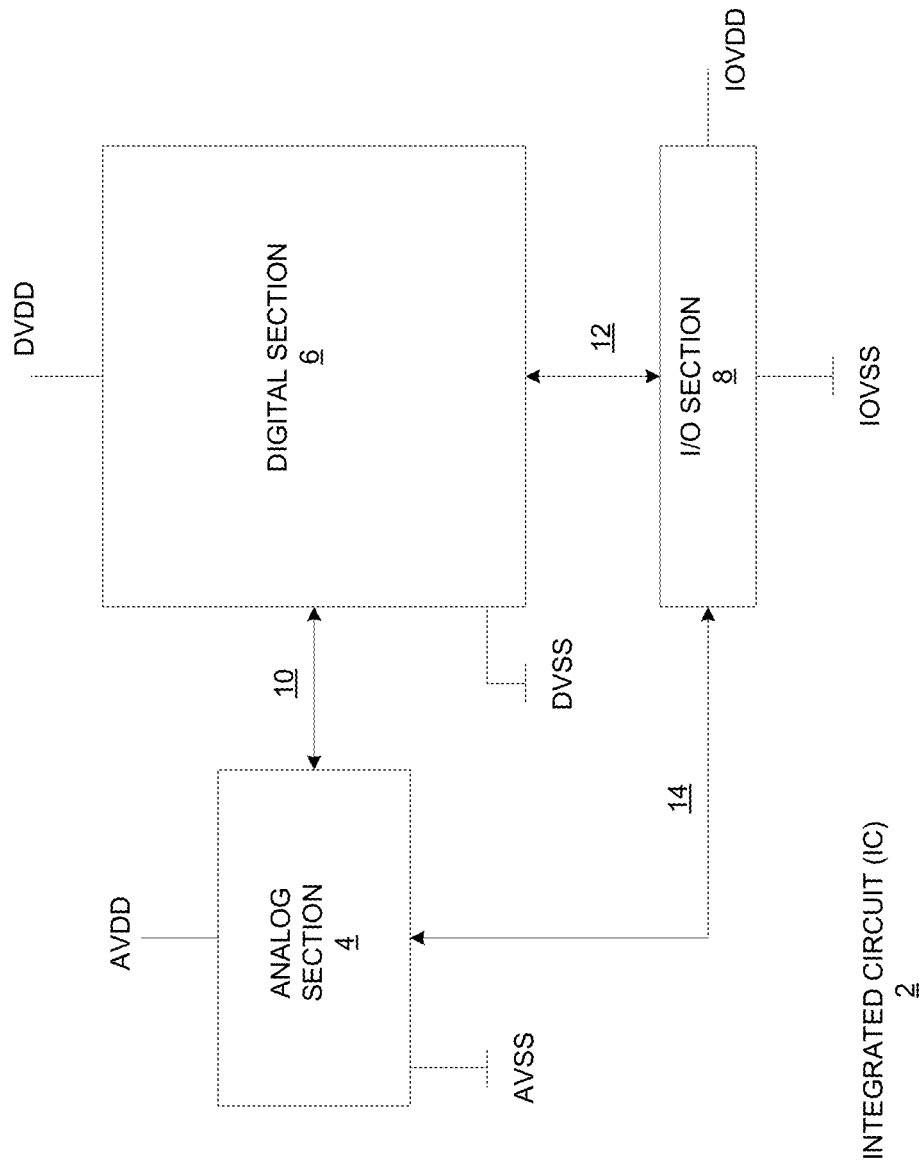
FIG. 1 illustrates a schematic diagram of an integrated circuit (IC) that includes a plurality of circuit domains.
Figure 2:
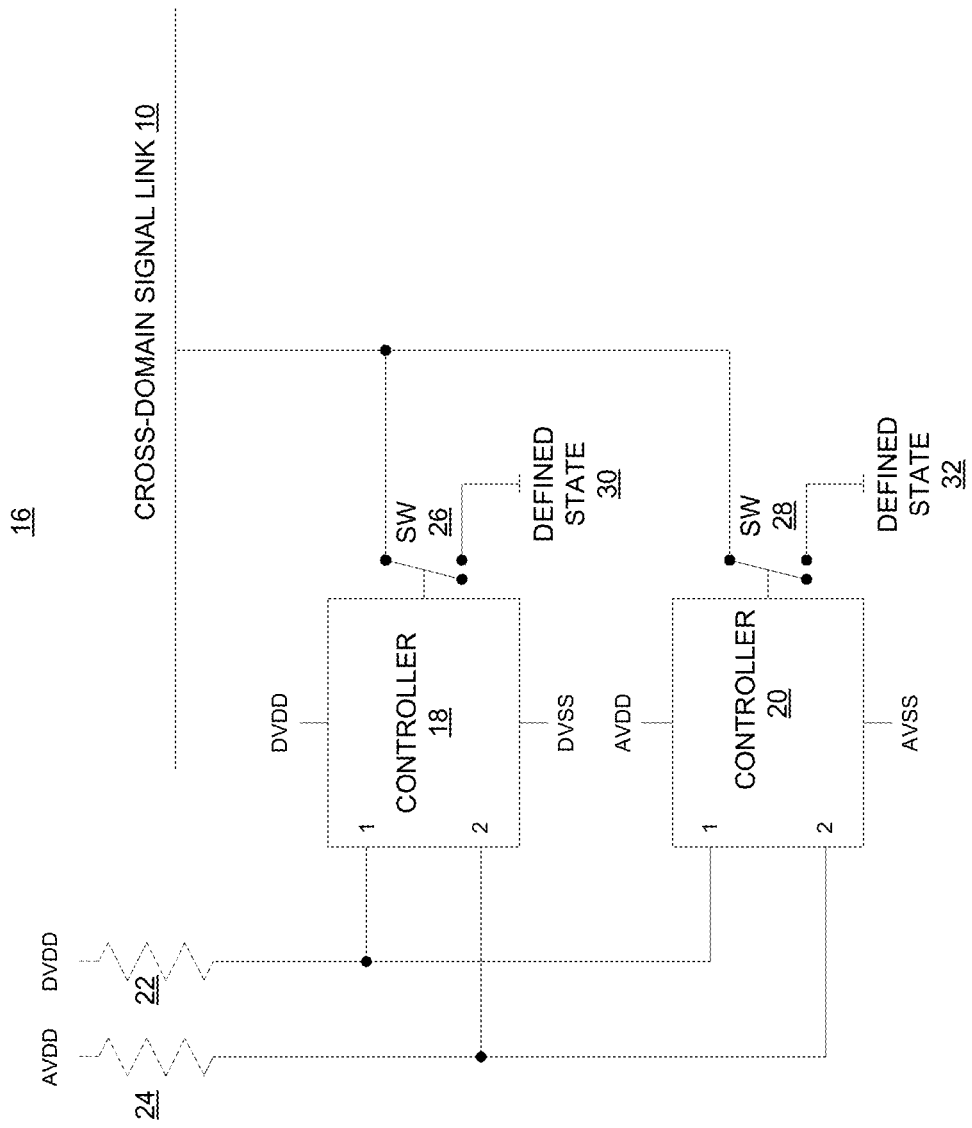
FIG. 2 illustrates an interface circuit for a cross-domain connection according to an exemplary embodiment of the present invention.

FIG. 2 illustrates a control circuit 16 that may maintain the cross-domain signal link in defined states according to an embodiment of the present invention. For the convenience of illustration, the control circuit 16 works with the cross-domain signal link 10 between analog circuit section 4 and digital circuit section 6. However, control circuits for other cross-domain signal links may be similarly constructed with the principles of the present invention. The control circuit 16 as shown in FIG. 2 may include controllers 18, 20, resistors 22, 24 (optional), and switches 26, 28. Controllers 18, 20 each includes a first input coupled to DVDD via a first resistor 22 and a second input coupled to AVDD via a second resistor 24. An output of controller 18 may control the engagement of switch 26, and an output of controller 20 may control the engagement of switch 28. The switch 26 when engaged may connect the cross-domain signal link 10 to a defined state 30, and the switch 28 when engaged may connect the cross-domain signal link 10 to a defined state 32. The first controller 18 may be powered by DVDD, and the second controller 20 may be powered by AVDD.

In operation, the inputs of the controllers 18, 20 may determine whether the cross-domain signal link 10 is pulled down (or pulled up) to the defined states 26, 28. More specifically, in operation, when the digital circuit section 6 is powered up (or DVDD is high) while the analog circuit section 4 is not powered up (or AVDD is low), controller 18 powered by DVDD may operate to engage switch 26 so that the cross-domain signal link 10 is pulled down (or pulled up) to the defined state 30. Similarly, when the analog circuit section 4 is powered up (or AVDD is high) while the digital circuit section 6 is not powered up (or DVDD is low), controller 20 powered by AVDD may operate to engage switch 28 so that the cross-domain signal link 10 is pulled down (or pulled up) to the defined state 32. When analog circuit section 4 and digital circuit section 6 are both powered up, controllers 18, 20 respectively may operate to disengage switches 26, 28 respectively. In this event, the cross-domain signal link 10 may maintain whatever state it is already in. In one exemplary embodiment, a defined state may correspond to the ground reference. Thus, the defined state 30 may correspond to DVSS, and the defined state 32 may correspond to AVSS. In an alternative embodiment, a defined state may correspond to the high voltage references. Thus, the defined state 30 may correspond to DVDD, and the defined state 32 may correspond to AVDD. The following illustrates a number of specific exemplary embodiments of the present invention.

Figure 3:
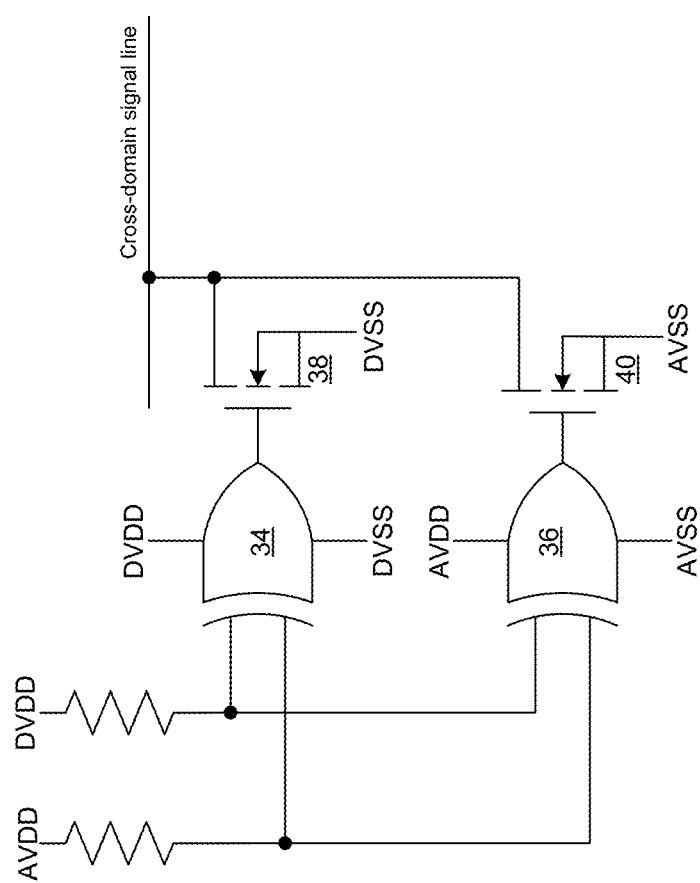
FIG. 3 illustrates an interface circuit including an exclusive-or for a cross-domain connection according to an exemplary embodiment of the present invention.

FIG. 3 illustrates a specific control circuit 16 according to an exemplary embodiment of the present invention. In this embodiment, the controllers 18, 20 as shown in FIG. 2 may be implemented with exclusive-or circuits 34, 36 respectively, and the switches 26, 28 as shown in FIG. 2 are realized with NMOS transistors 38, 40. The outputs of exclusive-or circuits 34, 36 may control the on and off of the NMOS 38, 40. Thus, if only DVDD is applied to the digital circuit section 6, exclusive-or 34 may be powered up. A first input of the exclusive-or 34 coupled to the DVDD may be at logic ONE, while second input of the exclusive-or 34 coupled to AVDD may be at logic ZERO since an unpowered supply is normally 0V or high impedance. In this case, the control terminal of NMOS gate 38 may be driven high, pulling the cross-domain signal line down to DVSS. When AVDD is powered and DVDD is not, the cross-domain signal line may be similarly pulled down to AVSS. Since AVSS and DVSS are at the same potential, the cross-domain signal line may be driven to a logic ZERO when one of AVDD and DVDD is present. When both DVDD and AVDD are powered up, the inputs of both exclusive-or circuits 34, 36 may be both high and their outputs may be both logic ZEROs, thereby turning off both NMOS devices. In this state the cross-domain signal line may be free to assume whichever logic state is dictated by the transmitting domain with the signal delay only minimally affected by the slight increase in capacitive loading arising from the relatively small NMOS drains. The two exclusive-or circuits 34, 36 are in a static state, so their power dissipation is minimal and unaffected by activities occurred on the cross-domain signal line.

In one embodiment, DVDD and AVDD may be at the same or substantially the same voltage potential. Thus, the exclusive-circuits 34, 36 may be of standard design with a threshold of VDD/2. Alternatively, when DVDD is substantially different from AVDD, the exclusive-or circuits 34, 36 may be modified so that (1) both exclusive-circuits 34, 36 may be capable of proper operation with inputs at the higher of AVDD or DVDD, and (2) the switching thresholds of the exclusive-or circuits 34, 36 may be modified to ensure correct operation with inputs at the lower of (AVDD, DVDD) while powered from the higher of (AVDD, DVDD). The following example may further illustrate this point. Assume AVDD=3.3V and DVD=1.8V. One input of each exclusive-or circuits may be at 3.3V when power is applied to the AVDD domain. The exclusive-or circuits should be able to tolerate 3.3V with no damage to the exclusive-or circuits. Furthermore, the input threshold voltage of the AVDD-powered exclusive-or circuit may be sufficiently below 1.8V to ensure reliable operation and prevent the excessive flow of current within the exclusive-or when both supplies are present. In practice both requirements may be met with a single exclusive-or design that uses transistors appropriate for 3.3V operation and sized to provide input switching thresholds of roughly DVDD/2 (0.9V in this example).

Figure 4:
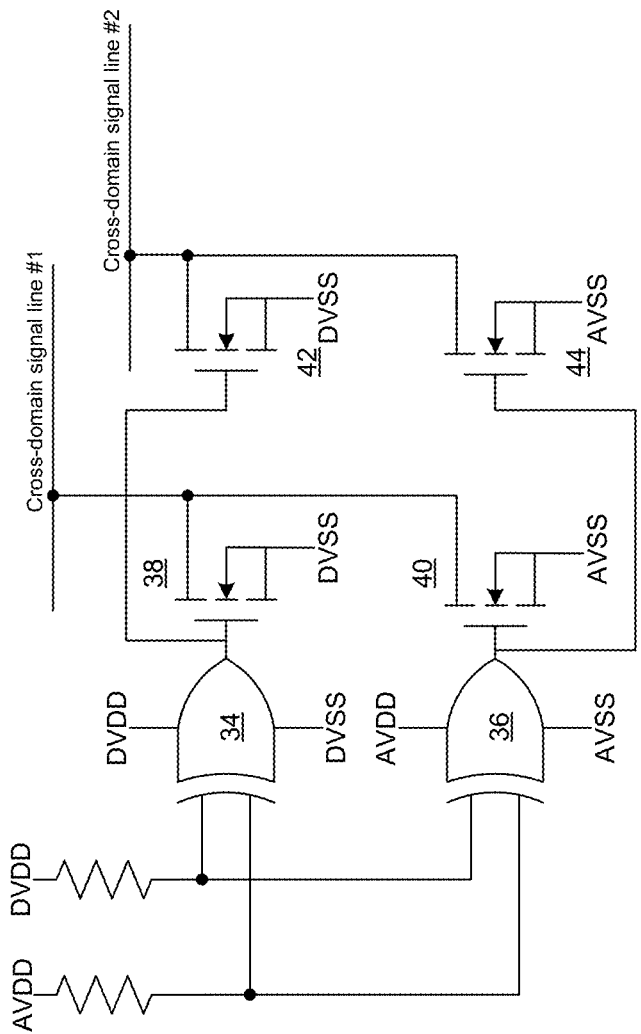
FIG. 4 illustrates an interface circuit for multiple cross-domain connections according to an exemplary embodiment of the present invention.

One advantageous aspect of the present invention is that present invention is easily expanded to multiple cross-domain signal lines between the analog and digital circuit sections reusing the same cross-domain signal controllers. FIG. 4 illustrates an expansion of the circuit of FIG. 3 to two cross-domain signal lines according to an exemplary embodiment of the present invention. As illustrated in FIG. 4, for each additional cross-domain signal line, the present invention may simply add two NMOS transistors 42, 44 as switches each controlled by the same exclusive-or circuits 34, 36. Thus, in operation, the second cross-domain signal link (no. 2) may operate in the same way as the first cross-domain signal link (no. 1) when one of the DVDD and AVDD is not powered up.

Figure 5:
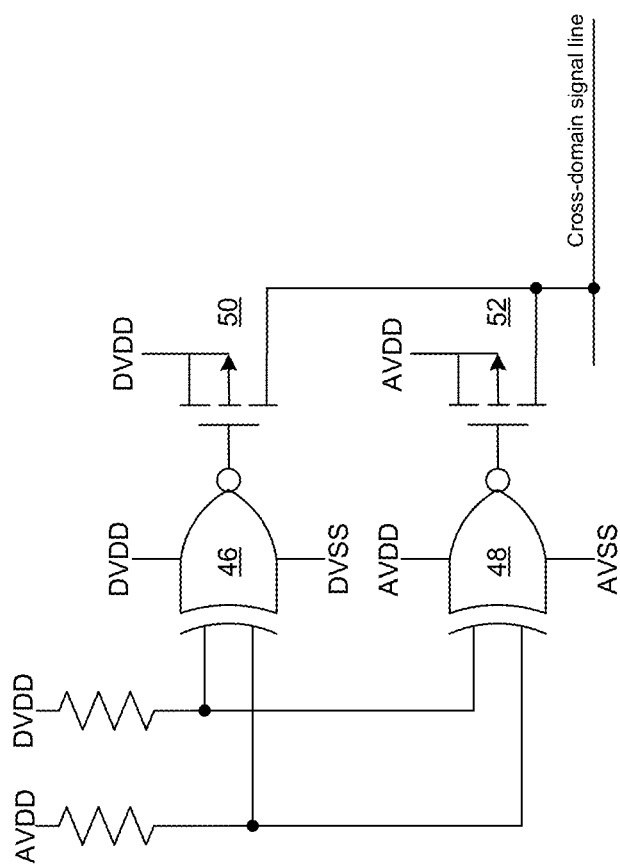
FIG. 5 illustrates an interface circuit including an exclusive-nor for a cross-domain connection according to an exemplary embodiment of the present invention.

FIGS. 3 and 4 illustrate embodiment using NMOS transistors. FIG. 5 shows embodiments of the present invention similarly constructed using other types of transistors and for cases where it might be desirable based on design and preconstraints to enable a pull-up condition as oppose to the pull-down condition described in connection with FIGS. 3 and 4. Under certain cross-domain situations, the receiving domain is powered up while the transmitting domain has not yet. An embodiment as shown in FIG. 5 may be used to ensure the cross-domain signal line in the well defined state of _VDD (e.g., DVDD or AVDD).

For example, the exclusive-or circuits 34, 36 may be replaced with exclusive-nor circuits 46, 48, and NMOS switches 38, 40 may be replaced with PMOS switches 50, 52 having their sources tied to their respective VDD supplies. Thus, when only DVDD is powered up while AVDD is not, an output at exclusive-nor 46 may turn on PMOS switch 50 so that the cross-domain signal line may be pulled up to DVDD. Similar, when only AVDD is powered up while DVDD is not, an output at exclusive-nor 48 may turn on PMOS switch 52 so that the cross-domain signal line may be pulled up to AVDD. When both DVDD and AVDD are supplied, the outputs from exclusive-nor circuits 46, 48 may turn off PMOS switches 50, 52. Thus, the cross-domain signal line may assume logic states of its transmission while exclusive-nor circuits 46, 48 are in a static state in which the power dissipation may be minimal and unaffected by activities on the cross-domain signal line.

The circuit as shown in FIG. 5 works well assuming that AVDD is approximately equal to DVDD. However, when one of AVDD and DVDD is substantially larger than the other, the Exclusive-nor may be modified to accommodate the non-equal voltage supplies. The sources of both PMOS pull-up transistors 50, 52 may be coupled to the receiving domain voltage supply DVDD. In addition, the threshold of the exclusive-nor 46 may be modified to a proper sizing so that it may operate properly when the receiving domain supply is greater than the transmitting domain supply. In one embodiment, the threshold may be chosen at AVDD/2. When the receiving domain voltage is lower than that of the transmitting domain, the PMOS devices should withstand the transmitting domain voltage on their gates.

Figure 6:
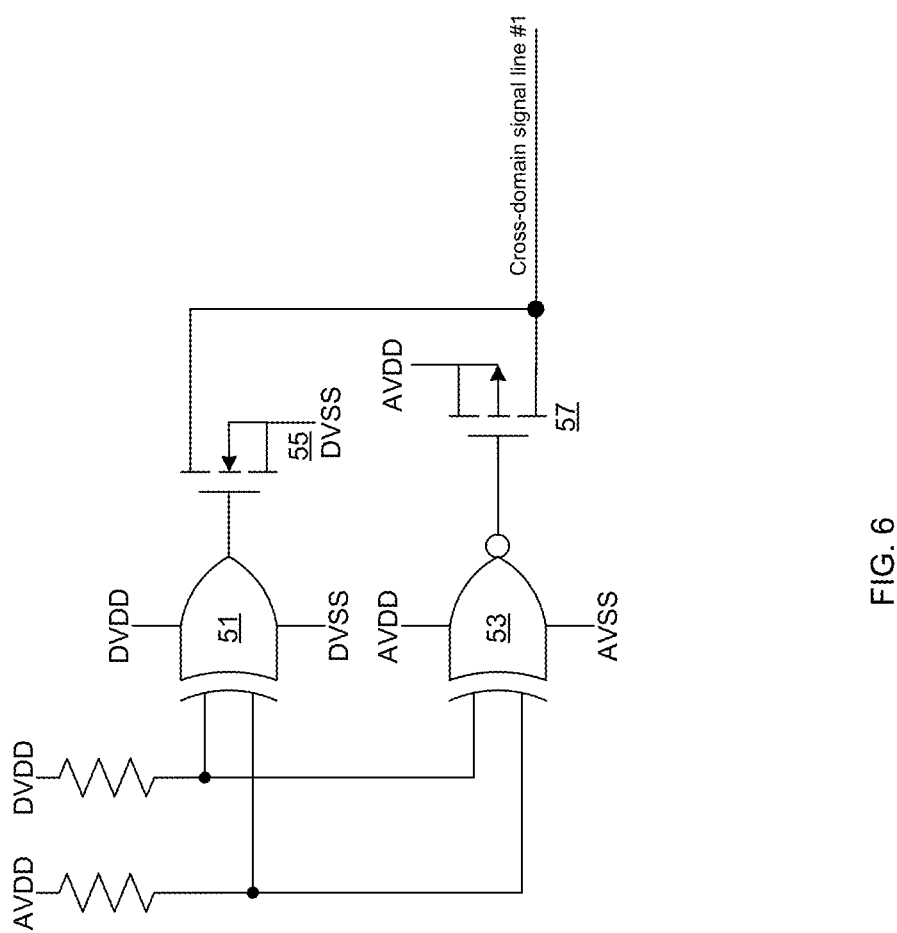
FIG. 6 illustrates another interface circuit including an exclusive-nor for a cross-domain connection according to an exemplary embodiment of the present invention.

In some embodiments, the cross-domain signal line may be pulled down to a first state if a first domain is not powered up and pulled up to a second state if a second domain is not powered up where the pull-up and pull-down do not occur at the same time. FIG. 6 illustrates an exemplary embodiment capable of pulling down and pulling up the cross-domain signal line. As shown in FIG. 6, if DVDD is available while AVDD is not, controller 51 may turn on NMOS 55 to pull down the cross-domain signal line. Conversely, if DVDD is not available while AVDD is, controller 53 may turn on PMOS 57 to pull up the cross-domain signal line. However, when both domains are powered up, controllers 51, 53 are not activated with power, and the cross-domain signal line is not affected by the interface circuit.

Figure 7:
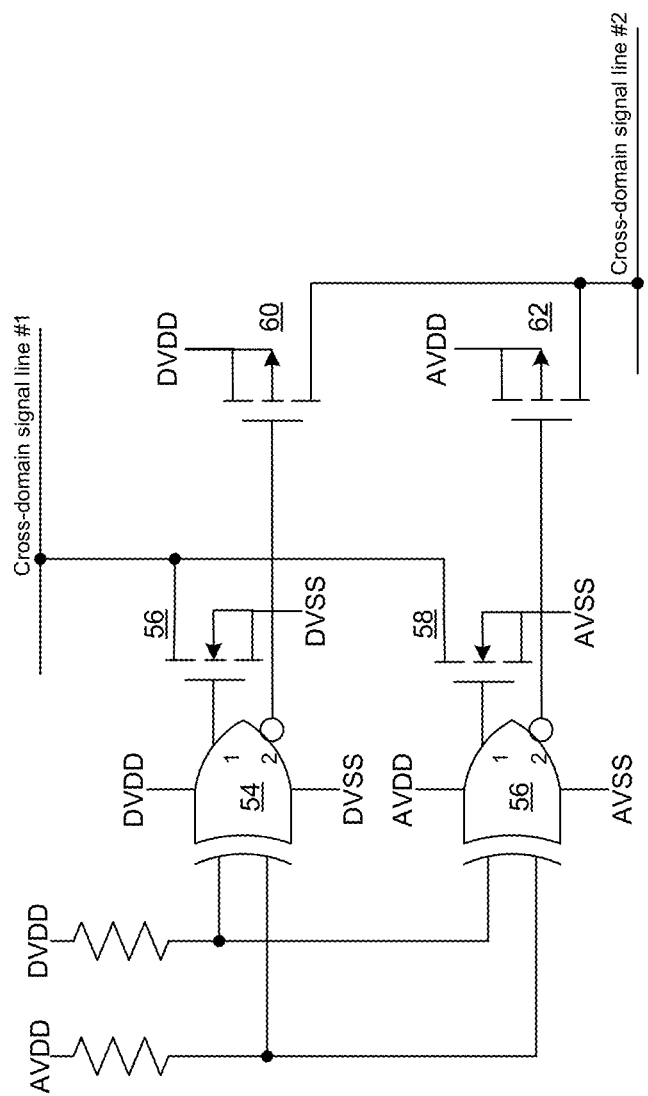
FIG. 7 illustrates an interface circuit including an exclusive-or/nor for a cross-domain connection according to an exemplary embodiment of the present invention.

In another embodiment of the present invention, the control circuit may use exclusive-or/nor circuits to drive both NMOS and PMOS switches. FIG. 7 illustrates a control circuit that includes exclusive-or/nor circuits. The control circuit as shown in FIG. 7 may include exclusive-or/nor circuits 54, 56, each including a first output (1) for logic-1 and a second complementary output (2) for logic-0. Further, the control circuit may include NMOS 56, 58 each having a gate respectively coupled to the logic-1 output of exclusive-or/nor circuits 54, 56, and PMOS 60, 62 each having a gate respectively coupled to logic-0 of exclusive-or/nor circuits 54, 56. The respective drains of NMOS 56, 58 may be coupled to cross-domain signal line 1, and the respective sources of NMOS 56, 58 may be coupled to DVSS and AVSS. The respective drains of PMOS 60, 62 may be coupled to cross-domain signal line 2, and the respective sources of PMOS 60, 62 may be coupled to DVDD and AVDD. Thus, as discussed in FIG. 3, exclusive-or/nor circuits 54, 56 (logic-1) may act to pull down cross-domain signal line 1 when one of AVDD and DVDD is not available, and as discussed in FIG. 5, exclusive-or/nor circuits 54, 56 (logic-0) may pull up cross-domain signal line 2 when one of AVDD and DVDD is not available. Similarly, exclusive-or/nor circuits 54, 56 may be customized for the event that AVDD and DVDD are substantially different as discussed in FIGS. 3 and 5.

Figure 8:
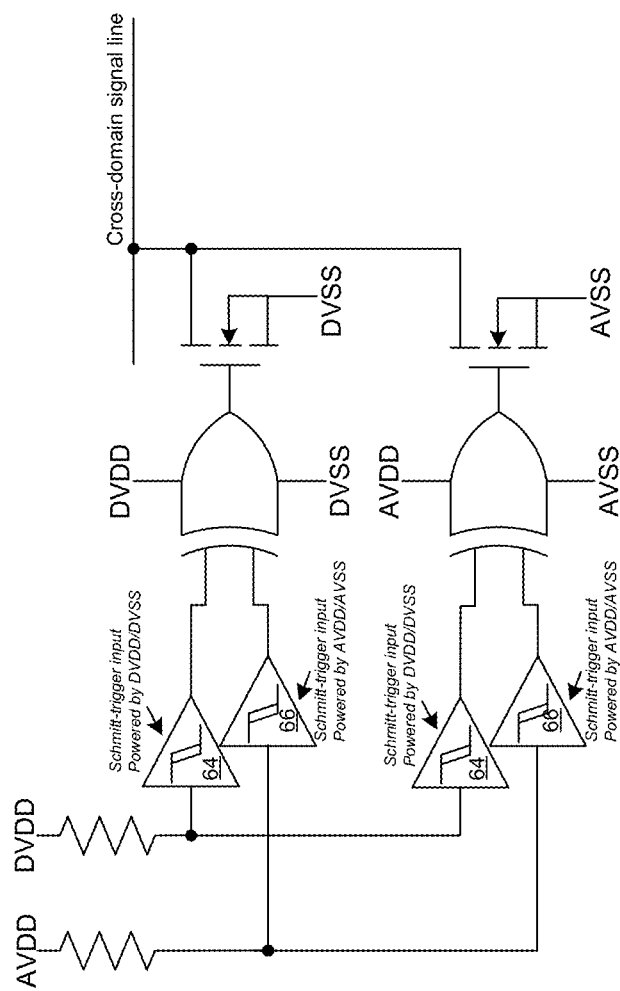
FIG. 8 illustrates an interface circuit including a Schmitt-trigger for a cross-domain connection according to an exemplary embodiment of the present invention.

When the power (DVDD, AVDD) supplies rise relatively slowly, there may be a shoot-through current across domains during the process of the slow rise. This shoot-through current may be controlled by adding threshold circuits to inputs of exclusive-or (or exclusive-nor) circuits of the control circuit. FIG. 8 illustrates a control circuit that includes threshold circuits according to another exemplary embodiment of the present invention. As shown in FIG. 8, each input of the exclusive-or may include a Schmitt-trigger. Thus, the first inputs may include first Schmitt-triggers 64 powered by DVDD, and the second inputs may include second Schmitt-triggers 66 powered by AVDD. As known in the art, a Schmitt-trigger may convert a slow rise curve into square waves with sharp edges, and may therefore eliminate shoot through currents during slow rises. Similar to FIG. 8, threshold circuits such as Schmitt-trigger may be applied to all of the embodiments discussed above to remove shoot through currents.

Figure 9:
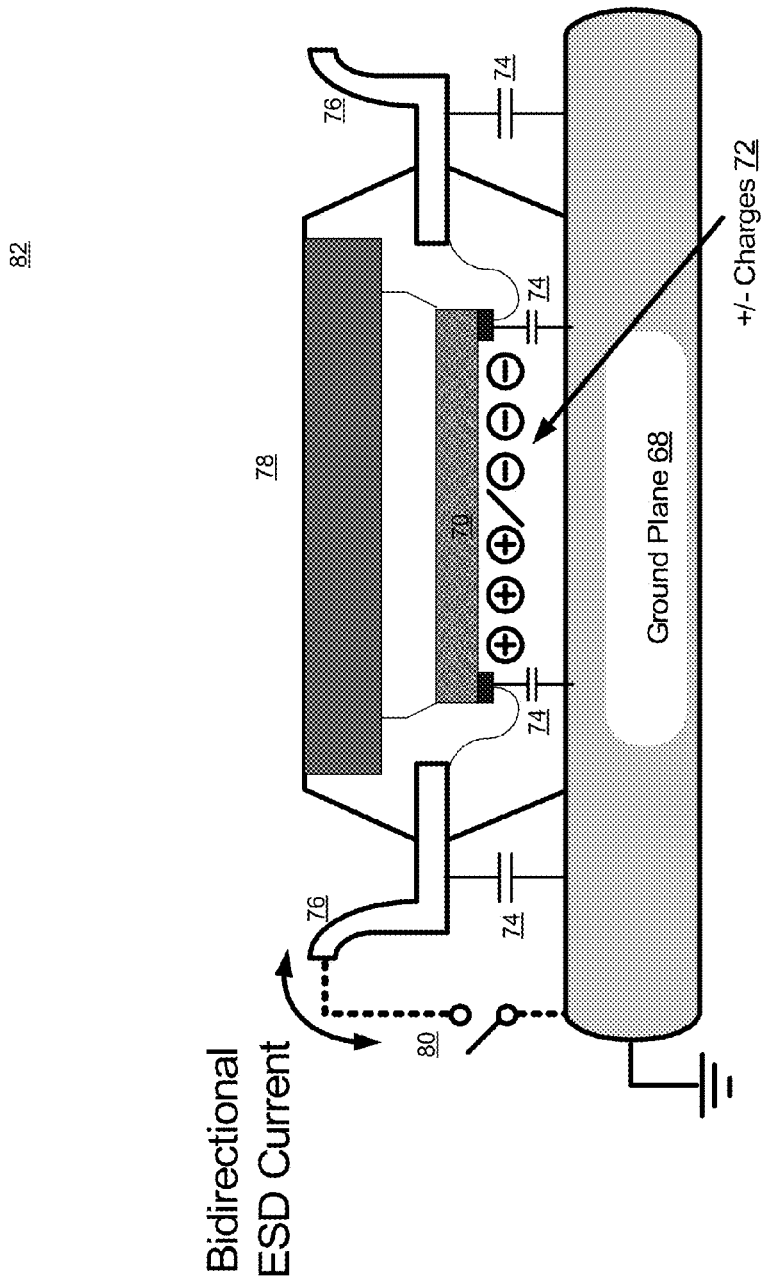
FIG. 9 illustrates a diagram for physical structure of an IC circuit with parasitic capacitance including a charge built-up between the die and the external surface.

Through the cross-domain signal link switches, in addition to ensuring different domains of an IC circuit staying in well-defined states during power up, the control circuits as shown in FIGS. 2-8 may also protect the integrated circuits (ICs) against Electro-Static Discharge (ESD) events by providing current discharge paths during cross-domain stress conditions. FIG. 9 illustrates a diagram of an IC structure 82 (upside down) that includes accumulated charges in a die area 72. As shown in FIG. 9, the IC structure 82 may include an external ground plane 68, a die area 70, a package 78, and pins 76. The IC structure 82 may also include effective capacitance 74 on which electric static charge 72 may be accumulated from each IC power domain on the die to the external ground plane. The charge 72 may include either positive or negative charges. When the IC is handled during manufacturing and assembly, a conducting link 80 can be formed between a pin 76 and the ground, at which condition the so-called field-induced charged device model (FICDM) type of ESD events may occur. When ESD events occur, static electric charges 72 accumulated in a large domain capacitance may generate large ESD currents in a short time that may force current path from gates to sources in MOS transistors and damage the IC.

Figure 10:
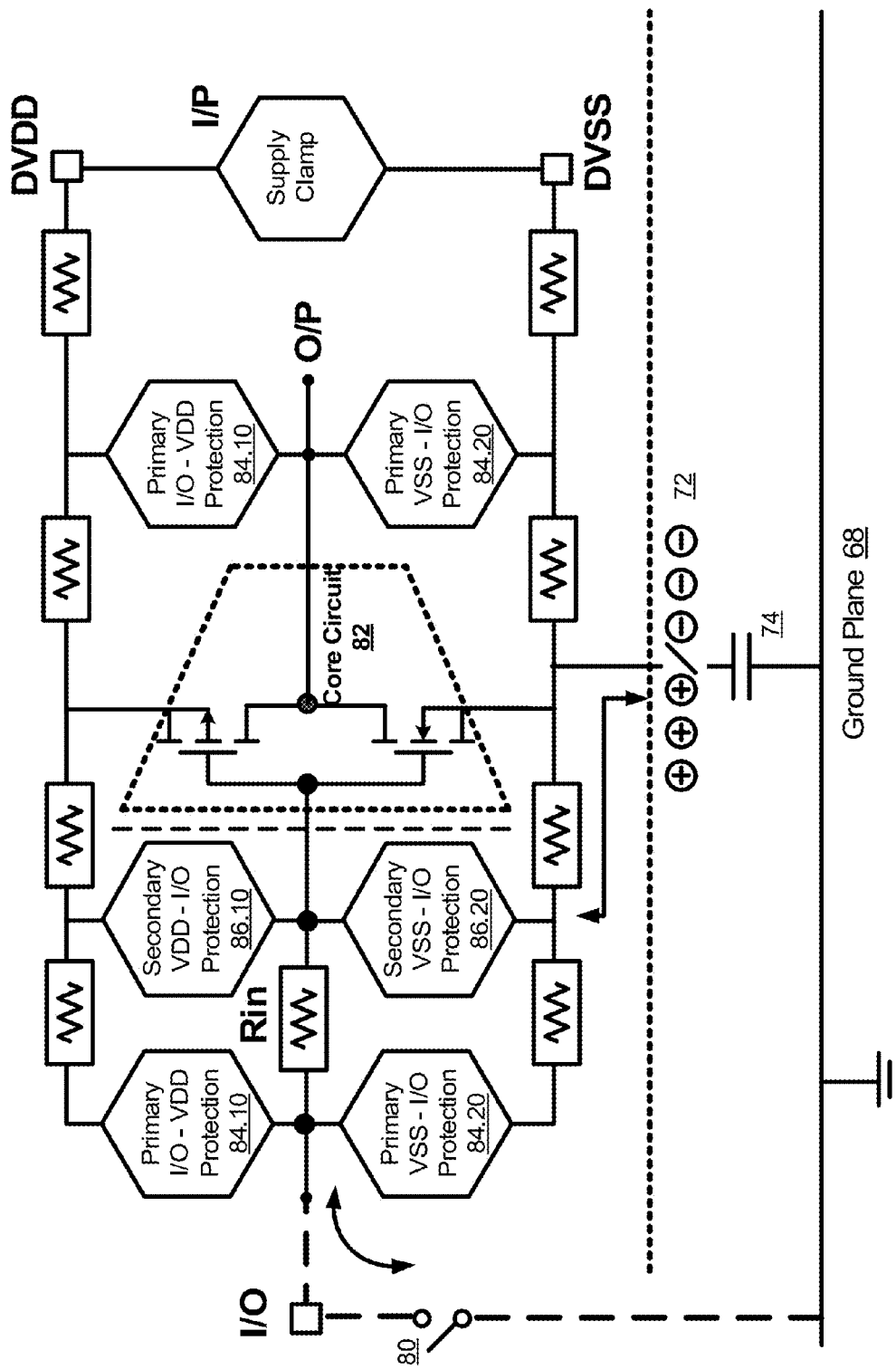
FIG. 10 illustrates an IC including primary and secondary I/O protections.

Therefore, ICs include protections against ESD events. FIG. 10 illustrates protective circuits that are commonly used to protect an IC at the pad level. As shown in FIG. 10, an IC may include core circuit 82 that may include a plurality of PMOS/NMOS transistors. As discussed in conjunction with FIG. 9, static charge 72 may be accumulated on effective capacitors 74 between the power domains in the die area and external ground plane 68. Without protection, the charge 72 may cause destructive ESD currents passing through gates in the core circuit 82 and damage the core circuit. Two layers of protection are commonly used to protect ICs from ESD events. External primary I/O protection circuits 84.10, 84.20 may provide a first protection layer against large but slow destructive currents, and internal secondary I/O protection circuits 86.10, 86.20 provides a second protection layer against small but fast destructive currents. During operation without ESD events, the primary and secondary I/O protections stay idle and do not perform protection functions. When ESD events occur, the primary and secondary I/O protections may become activated so that positive charges (+) may be safely discharged through primary protection circuits 84.20 and secondary protection circuits 86.20, and negative charges (−) may be safely discharged through primary protection circuits 84.10 and secondary protection circuits 86.10.

Figure 11:
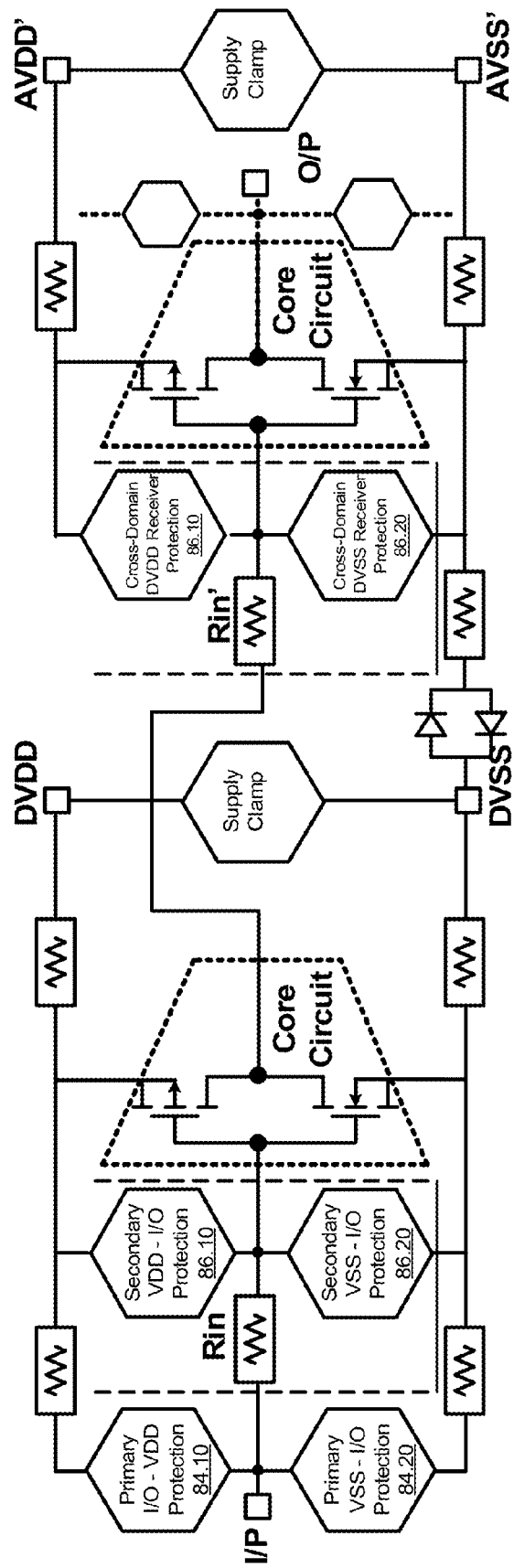
FIG. 11 illustrates an IC including multiple circuit domains and primary and secondary I/O protections.

Further complexity is identified for an IC that includes multiple circuit domains, for which cross-domain interface protection circuits 86.10, 86.20 may be placed between circuit domains to prevent ESD currents from one dominant circuit domain destructively discharged to another circuit domain. FIG. 11 illustrates an IC that includes two circuit domains where a first circuit domain is powered by AVDD and a second circuit domain is powered by DVDD. A pair of cross-domain protection circuits 86.10, 86.20 are placed between the first and second domains to prevent ESD currents across domains. In practice, cross-domain protection circuits may occupy large circuit areas and are often difficult to integrate to achieve robust FICDM robustness in large circuits due to unpredictable cross-domain power sequencing constraints that can appear during the circuit handling and cause high power dissipation that these cross-domain protection devices are not able to handle. It is noted that the exemplary control circuits as shown in FIGS. 2 to 8 may be designed to achieve the dual objectives of protecting an IC against ESD events and ensuring circuit domains in the IC in well-defined states during power sequencing.

Figure 12A:
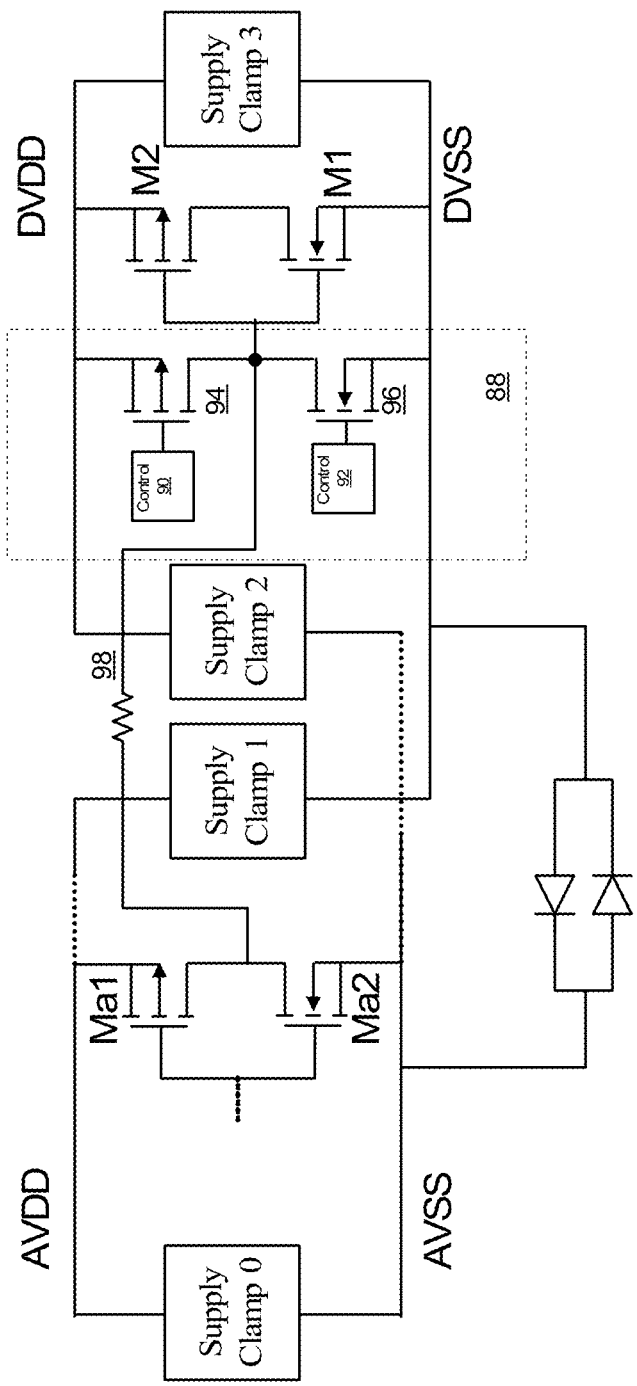
FIGS. 12A-12E illustrate ICs including a co-designed interface circuit for a cross-domain connection and built-in cross-domain protection according to an exemplary embodiment of the present invention.

FIG. 12A illustrates an IC circuit that includes a co-designed ESD protection and cross-domain interfacing circuit according to an exemplary embodiment of the present invention. As shown in FIG. 12A, the IC may include a first circuit domain powered by AVDD/AVSS and a second circuit domain powered by DVDD/DVSS. The first circuit domain may include a first plurality of NMOS/PMOS (including M1, M2), and the second circuit domain may include a second plurality of PMOS/NMOS (including such as Ma1, Ma2). Gates of the first and second plurality of NMOS/PMOS may be exposed to destructive ESD currents if there is no protection. In particular, focusing on the DVDD/DVSS receiver domain, to protect, the IC circuit may include a co-design interface circuit 88 that interfaces between the first and second circuit domains. The co-designed interface circuit 88 may be designed: 1) to ensure the first and second circuit domain always in well-defined states during a power-up of the IC and 2) to protect core circuits against ESD events. The co-designed interface circuit 88 may include different combinations of control circuits as shown in FIGS. 2 to 8. In one embodiment, co-designed interface circuit 88 may include a first control circuit that may include a first controller 90 and a PMOS transistor 94 whose gate is coupled to an output of the first controller 90, source is coupled to DVDD, and drain is coupled to a cross-domain signal line 98. Further, co-designed interface circuit 88 may include a second control circuit that may include a controller 92 and a NMOS transistor 96 whose gate is coupled to an output of the second controller 92, source is coupled to DVSS, and drain is couple to the cross-domain signal line 98. In one embodiment, the first controller may include an exclusive-NOR, and the second controller may include an exclusive-OR.

The sizes of PMOS transistor switches for coupling a receiving domain to a transmitting domain may need to be selected to withstand different scenarios. When using a PMOS-based pulled up as part of the cross-domain co-design, a current may pass through the back-gate (body diode) of the PMOS for the receiving domain if the receiving domain is unpowered and the transmitting domain is powered. To address this situation, the body diode of the PMOS for the receiving domain may be sized accordingly so that the forward-biased body diode can safely handle the maximum transmitting domain output current.

During a power up of the IC, one of the first and second control circuits may act similarly to the interfaces as shown in FIGS. 2 to 8 to ensure each of the circuit domains is in well defined states. For example, if only one of AVDD and DVDD is powered up, the first controller 90 may be configured with switching voltage thresholds to trigger PMOS 94 and pull the cross-domain signal line 98 to the well-defined state of DVDD, while the second controller 92 may be configured to stay inactive. Alternatively, if only one of AVDD and DVDD is powered up, the second controller 92 may be configured with switching voltage thresholds to trigger NMOS 96 and pull the cross-domain signal line 98 to the well-defined state of DVSS, while the second controller 90 may be configured to stay inactive.

Additionally, the co-designed interface circuit 88 may provide full-level cross-domain ESD protection. PMOS 94 and NMOS 96 may be designed to be small (<10 µm) in width and be able to operate in one direction as a bipolar device, e.g., PNP for PMOS and NPN for NMOS, and as body diode in the opposite direction. In the event that ESD occurs, the quick rise of ESD currents activate both PMOS 94 and NMOS 96 and create protective current bypasses to safely discharge ESD currents and prevent ESD currents from passing through the gates of M1 and M2. In this way, the co-designed interface circuit 88 includes, as built-in part, logic state control and ESD prevention.

Figure 12B:
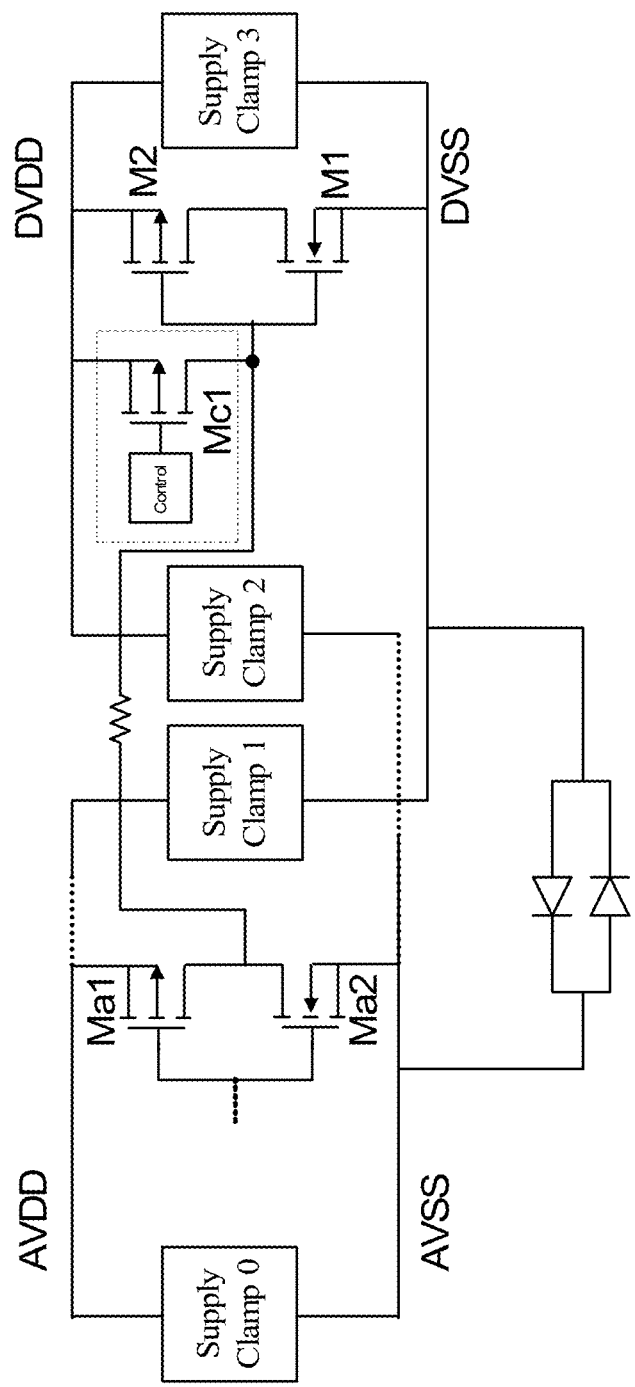
Figure 12C:
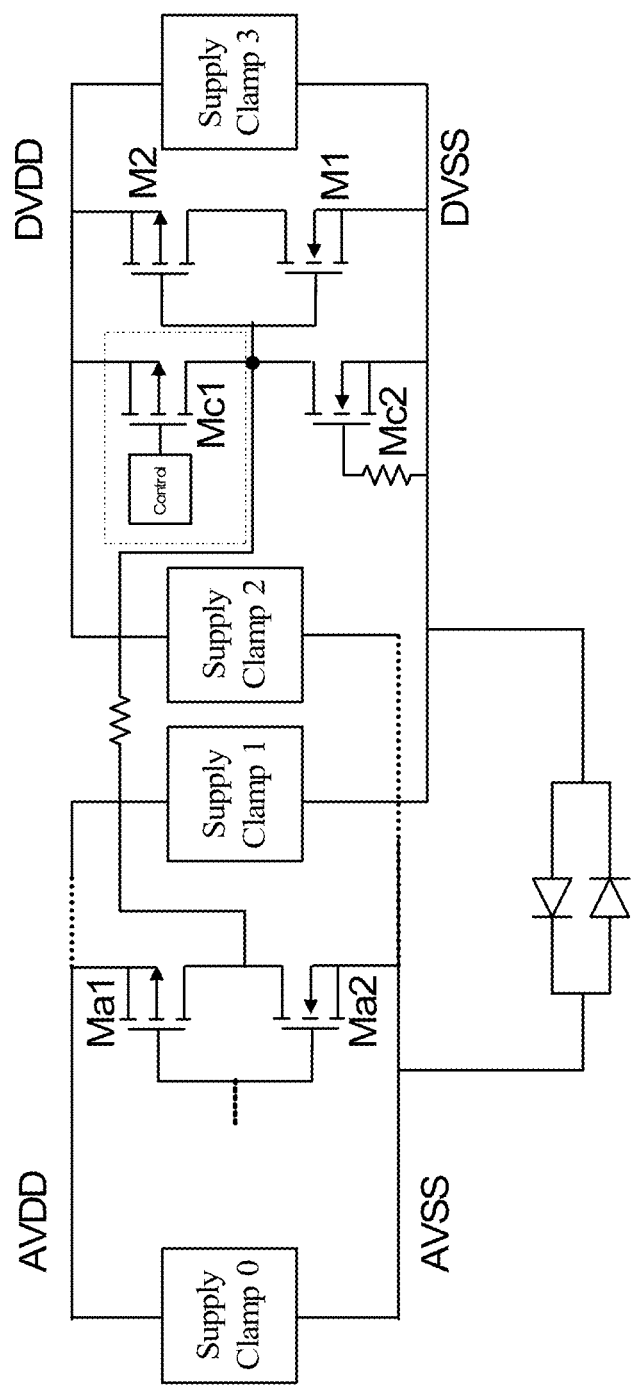
Figure 12D:
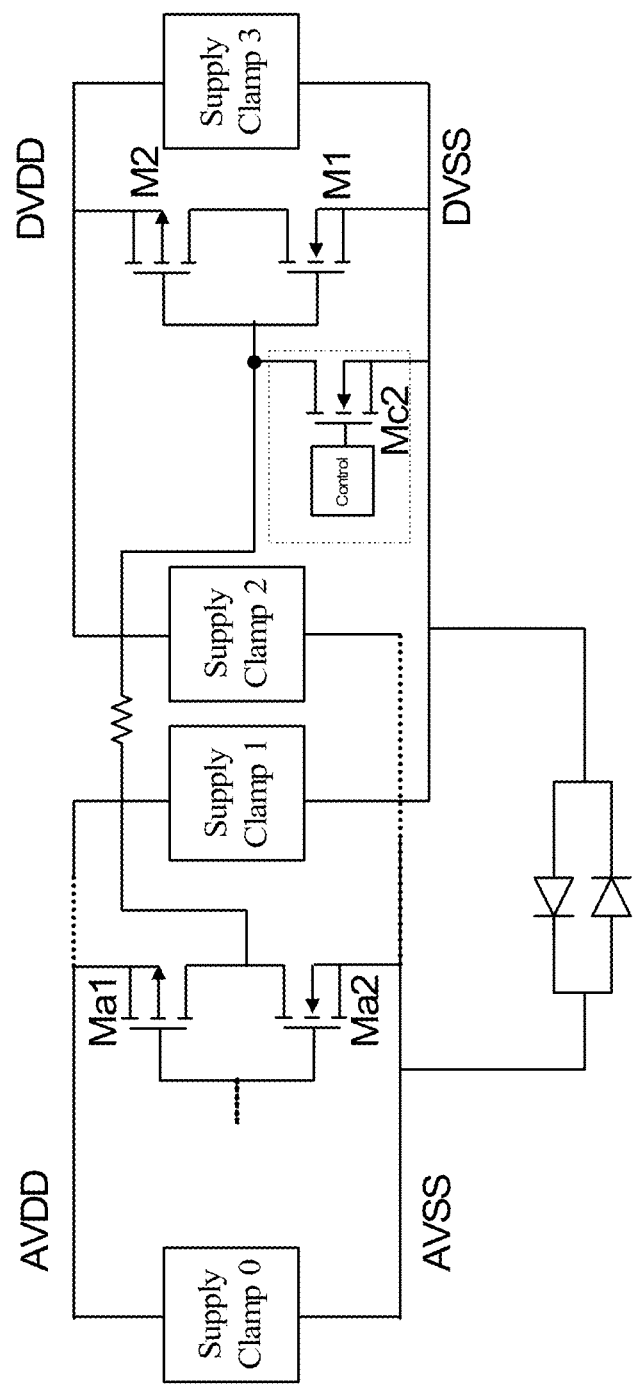

FIG. 12B illustrates another IC circuit that includes a co-designed ESD protection and cross-domain interfacing circuit according to an exemplary embodiment of the present invention. In this embodiment, a pull-up circuit may include a controller and a PMOS transistor (MC1), whereas the pull-up circuit similar to the one shown in FIG. 5 may pull the cross-domain signal line to a well defined state (DVDD) if the power domain AVDD is not powered up while the power domain DVDD is up already. The pull-up circuit may similarly include a pull-up portion for AVDD (not shown). FIG. 12D illustrates another IC circuit that includes a co-designed ESD protection and cross-domain interfacing circuit according to an exemplary embodiment of the present invention.

This embodiment includes a pull-down circuit that includes a controller and an NMOS transistor (MC2) for pulling down to a well defined state (DVSS) if the power domain AVDD is not powered up while the power domain DVDD is up already. The pull-down circuit may similarly include a pull-down portion for AVDD (not shown). Both the pull-up and pull-down circuits as shown in FIGS. 12B and 12D may provide current diversion paths in the event of ESD.

Figure 12E:
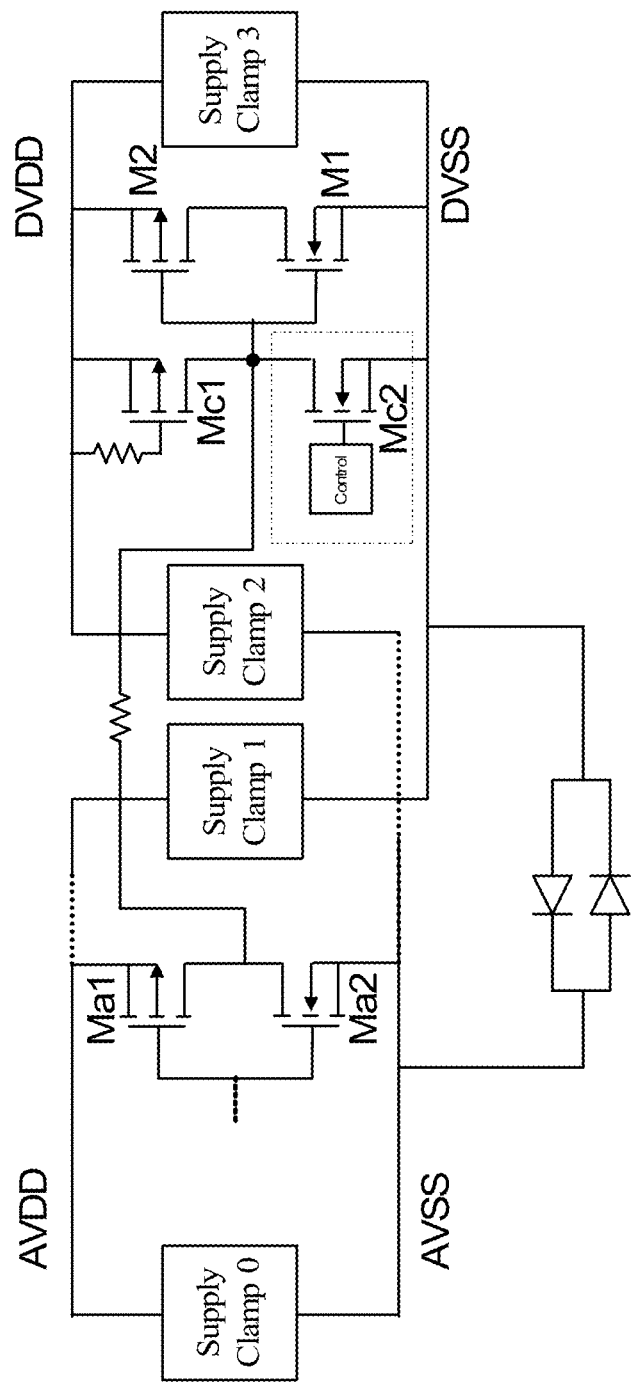

The embodiments as shown in FIGS. 12B and 12D may include an inactive current path to further enhance ESD protection. FIG. 12C illustrates another IC circuit that includes a co-designed ESD protection and cross-domain interfacing circuit according to an exemplary embodiment of the present invention. In this embodiment, an inactive (or OFF) NMOS transistor (MC2) is coupled between the cross-domain signal line and DVSS. This inactive NMOS does not affect the cross-domain signals during normal operation. However, in the event of ESD, NMOS may be turned on as a NPN bipolar or forward body diode depending on the drain-source positive or negative stress voltage, respectively, to provide additional current paths and divert ESD currents to the power rail and away of the receiver gate. FIG. 12E including a complementary inactive PMOS (MC1) is a corresponding embodiment for the pull-down circuit of FIG. 12D.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. An interface circuit for controlling a cross-domain signal link between a first circuit domain powered by a first voltage source and a second circuit domain powered by a second voltage source in a circuit, comprising:
   first and second controllers, each of the first and second controllers including a first input coupled to the first voltage source of the first circuit domain and a second input coupled to the second voltage source of the second circuit domain, the first controller being powered by the first voltage source and the second controller being powered by the second voltage source;
   a first switch controlled by an output of the first controller, the first switch including a first end coupled to the cross-domain signal link and a second end coupled to a first defined voltage state; and
   a second switch controlled by an output of the second controller, the second switch including a first end coupled to the cross-domain signal link and a second end coupled to a second defined voltage state,
   wherein, during a power-up of the circuit, if one of the first and second voltage sources is unavailable, at least one of the first and second controllers generates a control signal to engage at least one of the first and second switches and pull the cross-domain signal link to one of the first and second defined voltage states,
   wherein the first and second controllers include respectively a first exclusive-or and a second exclusive-or.

2. The interface circuit of claim 1, wherein the first and second switches include respectively a first NMOS transistor and a second NMOS transistor.

3. The interface circuit of claim 2, wherein a gate of the first NMOS transistor is coupled to the first exclusive-or, a drain of the first NMOS transistor is coupled to the cross-domain signal link, a source of the first NMOS transistor is coupled to the first defined voltage state, a gate of the second NMOS transistor is coupled to the second exclusive-or, a drain of the second NMOS transistor is coupled to the cross-domain signal link, and a source of the second NMOS transistor is coupled to the second defined voltage state.

4. The interface circuit of claim 1, further comprising at least one of the first and second inputs of the first and second controllers is coupled to a Schmitt-trigger.

5. The interface circuit of claim 1, wherein the first and second voltage sources are at substantially a same voltage level.

6. An interface circuit for controlling a cross-domain signal link between a first circuit domain powered by a first voltage source and a second circuit domain powered by a second voltage source in a circuit, comprising:
   first and second controllers, each of the first and second controllers including a first input coupled to the first voltage source of the first circuit domain and a second input coupled to the second voltage source of the second circuit domain, the first controller being powered by the first voltage source and the second controller being powered by the second voltage source;
   a first switch controlled by an output of the first controller, the first switch including a first end coupled to the cross-domain signal link and a second end coupled to a first defined voltage state; and
   a second switch controlled by an output of the second controller, the second switch including a first end coupled to the cross-domain signal link and a second end coupled to a second defined voltage state,
   wherein, during a power-up of the circuit, if one of the first and second voltage sources is unavailable, at least one of the first and second controllers generates a control signal to engage at least one of the first and second switches and pull the cross-domain signal link to one of the first and second defined voltage states,
   wherein the first and second controllers include respectively a first exclusive-nor and a second exclusive-nor.

7. The interface circuit of claim 6. wherein the first and second switches include respectively a first PMOS transistor and a second PMOS transistor.

8. The interface circuit of claim 7, wherein a gate of the first PMOS transistor is coupled to the first exclusive-nor, a drain of the first PMOS transistor is coupled to the cross-domain signal link, a source of the first PMOS transistor is coupled to the first defined voltage state, a gate of the second PMOS transistor is coupled to the second exclusive-nor, a drain of the second PMOS transistor is coupled to the cross-domain signal link, and a source of the second PMOS transistor is coupled to the second defined voltage state.

9. The interface circuit of claim 6, wherein each of the first and second inputs of the first and second controllers is coupled to a Schmitt-trigger.

10. The interface circuit of claim 6, wherein the first and second voltage sources are at substantially a same voltage level.

11. A cross-domain co-designed interface circuit for controlling a cross-domain signal link between a first circuit domain and a second circuit domain in a circuit and preventing electrostatic discharge (ESD) events, comprising:
   first and second controllers, each of the first and second controllers including a first input coupled to a first voltage source of the first circuit domain and a second input coupled to a second voltage source of the second circuit domain, the first controller being powered by the first voltage source and the second controller being powered by the second voltage source;

an NMOS transistor, including a gate coupled to an output of the first controller, a source coupled to a first reference voltage of the first circuit domain, and a drain coupled to the cross-domain signal link; and a PMOS transistor, including a gate coupled to an output of the second controller, a source coupled to a second reference voltage of the first circuit domain, and a drain coupled to the cross-domain signal link, wherein the first controller includes an exclusive-or, and the second controller includes an exclusive-nor.

12. The cross-domain co-designed interface circuit of claim 11, wherein, during a power-up of the circuit, if one of the first and second voltage sources is unavailable, one of the first and second controllers generates a control signal to engage one of the NMOS transistor and PMOS transistor and pull the cross-domain signal link to one of the first and second reference voltages.

13. The cross-domain co-designed interface circuit of claim 11, further comprising at least one of the first and second inputs of the first and second controllers is coupled to a Schmitt-trigger.

14. A cross-domain co-designed interface circuit for controlling a cross-domain signal link between a first circuit domain and a second circuit domain in a circuit and preventing electrostatic discharge (ESD) events, comprising:

first and second controllers, each of the first and second controllers including a first input coupled to a first voltage source of the first circuit domain and a second input coupled to a second voltage source of the second circuit domain, the first controller being powered by the first voltage source and the second controller being powered by the second voltage source;

an NMOS transistor, including a gate coupled to an output of the first controller, a source coupled to a first reference voltage of the first circuit domain, and a drain coupled to the cross-domain signal link; and a PMOS transistor, including a gate coupled to an output of the second controller, a source coupled to a second reference voltage of the first circuit domain, and a drain coupled to the cross-domain signal link, wherein, during an ESD event, both the NMOS transistor and PMOS transistor are engaged to discharge ESD currents and prevent the ESD currents from passing through the first and second circuit domains.

15. The cross-domain co-designed interface circuit of claim 14, further comprising at least one of the first and second inputs of the first and second controllers is coupled to a Schmitt-trigger.

16. A cross-domain co-designed interface circuit for controlling a cross-domain signal link between a first circuit domain and a second circuit domain in a circuit and preventing electric-static discharge (ESD) events, comprising:

a first controller including a first input coupled to a first voltage source of the first circuit domain and a second input coupled to a second voltage source of the second circuit domain, the first controller being powered by the first voltage source;

a PMOS transistor, including a gate coupled to an output of the first controller, a source coupled to a first voltage source of the first circuit domain, and a drain coupled to the cross-domain signal link;

a second controller including a first input coupled to the first voltage source of the first circuit domain and a second input coupled to the second voltage source of the second circuit domain, the second controller being powered by the second voltage source;

a PMOS transistor, including a gate coupled to an output of a second controller, a source coupled to the second voltage source of the second circuit domain, and a drain coupled to the cross-domain signal link; and an inactive NMOS transistor coupled between the cross-domain signal link and a ground of the second circuit domain.

17. The cross-domain co-designed interface circuit of claim 16, further comprising at least one of the first and second inputs of the first and second controllers is coupled to a Schmitt-trigger.

18. A cross-domain co-designed interface circuit for controlling a cross-domain signal link between a first circuit domain and a second circuit domain in a circuit and preventing electric-static discharge (ESD) events, comprising:

a first controller including a first input coupled to a first voltage source of the first circuit domain and a second input coupled to a second voltage source of the second circuit domain, the first controller being powered by the first voltage source;

a NMOS transistor, including a gate coupled to an output of the first controller, a source coupled to a first reference voltage of the first circuit domain, and a drain coupled to the cross-domain signal link;

a second controller including a first input coupled to the first voltage source of the first circuit domain and a second input coupled to the second voltage source of the second circuit domain, the second controller being powered by the second voltage source;

a NMOS transistor, including a gate coupled to an output of the second controller, a source coupled to the second reference voltage of the second circuit domain, and a drain coupled to the cross-domain signal link; and an inactive PMOS transistor coupled between the cross-domain signal link and a second voltage source of the second circuit domain.

19. The cross-domain co-designed interface circuit of claim 18, further comprising at least one of the first and second inputs of the first and second controllers is coupled to a Schmitt-trigger.

* * * * *